(12) United States Patent
Hashimi

(10) Patent No.: US 6,528,413 B2
(45) Date of Patent: Mar. 4, 2003

(54) SEMICONDUCTOR DEVICE AND METHOD OF MANUFACTURING THE SAME

(75) Inventor: Kazuo Hashimi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/961,358

(22) Filed: Sep. 25, 2001

(65) Prior Publication Data

US 2002/0177304 A1 Nov. 28, 2002

(30) Foreign Application Priority Data

Mar. 27, 2001 (JP) ........................................ 2001-090796

(51) Int. Cl.[7] ........................................... H01L 21/4763
(52) U.S. Cl. ..................... 438/630; 438/659; 438/683
(58) Field of Search ................................ 438/629, 630, 438/648, 672, 683, 659

(56) References Cited

U.S. PATENT DOCUMENTS 5,990,493 A * 11/1999 Gardner et al. ............... 257/77
5,998,871 A * 12/1999 Urabe ......................... 257/754
6,277,739 B1 * 8/2001 Tseng .......................... 438/655
6,348,420 B1 * 2/2002 Raaijmakers et al. ........ 438/769
6,406,998 B1 * 6/2002 Prall et al. ................... 438/659

FOREIGN PATENT DOCUMENTS

JP          9-219515         8/1997

* cited by examiner

Primary Examiner—T. N. Quach
(74) Attorney, Agent, or Firm—Armstrong, Westerman & Hattori, LLP

(57) ABSTRACT

A semiconductor device comprises impurity diffusion layers formed in a semiconductor substrate and containing a metal element, whose siliciding activation energy is less than 1.8 eV, at a concentration of more than $1 \times 10^{11}$ atoms/cm$^2$ and less than $1 \times 10^{15}$ atoms/cm$^2$, an insulating film formed on the semiconductor substrate, contact holes formed in the insulating film on the impurity diffusion layers, and contact plugs formed via the contact holes. Accordingly, there is provided the semiconductor device that has a connection structure between an impurity-containing semiconductor layer and a conductive film and is capable of suppressing a leakage current generated at a contact portion between the impurity diffusion layer and the conductive film.

26 Claims, 8 Drawing Sheets

SEMICONDUCTOR DEVICE AND METHOD OF MANUFACTURING THE SAME

CROSS-REFERENCE TO RELATED APPLICATION

This application is based upon and claims priority of Japanese Patent Application No 2001-090796, filed in Mar. 27, 2001, the contents being incorporated herein by reference.

BACKGROUND OF THE INVENTION

1. Field of the Invention

The present invention relates to a semiconductor device and a method of manufacturing the same and, more particularly, a semiconductor device having a connection structure between an impurity-containing semiconductor layer and a conductive film and a method of manufacturing the same.

2. Description of the Prior Art

In recent years, the reduction of the consumption power of the semiconductor memory is required according to the increase of the use number of the mobile devices having the semiconductor memory.

The DRAM as one of the semiconductor memories has such a structure that the storage electrodes of the storage capacitor are connected to the impurity diffusion layers of the MOS transistor.

The charge (i.e. information) accumulated in the storage capacitor is reduced gradually by the leakage current from the storage node. Therefore, in order to maintain the accumulated charge at a predetermined value, the rewriting operation of the data in the storage capacitor is needed every predetermined period. This data rewriting operation is called the refresh operation.

If the period of the refresh operation is short, the consumption power of the DRAM is increased. Therefore, it is effective for the reduction in the consumption power to prolong the period of the refresh operation. For this reason, it is desired to improve the data holding characteristic (the refresh characteristic) of the storage node.

The refresh characteristic is limited by the junction leakage current that flows to the semiconductor substrate via the storage node of the memory cell. Various factors are expected as the causes to generate the junction leakage current, and thus it is not that such factors have already been clearly specified.

However, it is guessed that the generation of the junction leakage current is dominated by the crystal defects in the impurity diffusion layer, that are generated by the metallic contamination, the plasma exposure, etc. in the middle of the semiconductor device manufacturing steps.

For example, in the steps of forming the semiconductor element, the silicon substrate is exposed to the plasma several times in the etching steps to form the device isolation film, the sidewall, the bit line contact, the storage contact, etc.

Then, the step of forming the storage contact hole in the insulating film will be explained with reference to FIG. 1A hereunder.

In the situation that the MOS transistor 2 formed on the silicon substrate 1 is covered with the silicon oxide film 3, the first interlayer insulating film 4, and the second interlayer insulating film 5, the dry etching is applied to the silicon oxide film 3, the first interlayer insulating film 4, and the second interlayer insulating film 5 to form the contact hole 5a on one impurity diffusion layer 2a constituting the MOS transistor 2. The MOS transistor 2 is surrounded with the field oxide 8 formed on the silicon substrate 1. The dry etching is carried out via the window 6a of the resist pattern 6 formed on the second interlayer insulating film 5 until the first impurity diffusion layer 2a is exposed. Then, the storage electrode of the storage capacitor (not shown) formed on the second interlayer insulating film 5 is connected to the first impurity diffusion layer 2a via the contact hole 5a.

In the etching to form the contact hole 5a, the first impurity diffusion layer 2a in the single crystal silicon substrate 1 is subjected to the ion impact of the plasma to cause the crystal defect. If the defect is caused in the first impurity diffusion layer 2a, the leakage of the accumulated charge occurs at the connecting portion (storage node) to the storage capacitor that is connected via the contact hole 5a, whereby the data holding characteristic (the refresh characteristic) of the storage capacitor is degraded.

In FIG. 1A, the MOS transistor 2 has the second impurity diffusion layer 2b that is formed adjacent to the first impurity diffusion layer 2a to put the channel region 2c between them, and the gate electrode 2e that is formed on the channel region 2c via the gate insulating film 2d. The bit line 7 on the first interlayer insulating film 4 is connected to the second impurity diffusion layer 2b via another contact hole 4a that is formed in the silicon oxide film 3 and the first interlayer insulating film 4.

In the meanwhile, in the step of etching the insulating film of the storage contact portion, in order to improve the selective etching ratio of the silicon oxide film 3 to the first impurity diffusion layer 2a, the pressure of the etching atmosphere is lowered and also the peak-to-peak voltage $V_{pp}$ of the high frequency voltage applied to generate the ion is increased. However, if the voltage $V_{pp}$ is increased, the ion energy is increased to cause the crystal defect of the first impurity diffusion layer 2a in the silicon substrate 1.

In contrast, if the voltage $V_{pp}$ is reduced, the selective etching ratio of the silicon oxide film 3 to the first impurity diffusion layer 2a is lowered. Then, as shown in FIG. 1B, the first impurity diffusion layer 2a is dug to cause the storage contact failure.

Accordingly, as the method of reducing the degradation of the refresh characteristic, the method of lowering the voltage $V_{pp}$ is not employed, but the method of avoiding the contact between the semiconductor substrate 1 and the metal atoms by clearing the manufacturing environment, in particular, removing the metallic contamination in the equipment is employed. However, such method is insufficient to further improve the refresh characteristic.

SUMMARY OF THE INVENTION

It is an object of the present invention to provide a semiconductor device capable of suppressing a leakage current generated at a contact portion between an impurity diffusion layer and a conductive film, and a method of manufacturing the same.

According to the present invention, since the metal element such as titanium is introduced into the impurity diffusion layer of the semiconductor substrate, the leakage of the charges caused at the connecting portion between the impurity diffusion layer and the overlying conductive plug is reduced. The metal element is titanium, nickel, cobalt, or platinum whose siliciding activation energy is less than 1.8 eV.

For example, it is experimentally checked that, if the metal element such as titanium ion, etc. is introduced into the impurity diffusion layer from the plasma containing ion of the metal element, the crystal defect of the semiconductor (silicon) substrate caused by ion impact of the plasma employed in the etching is compensated and also the refresh characteristic of the DRAM memory cell is improved.

Accordingly, the crystal defect in the semiconductor single crystal is reduced not to lower the selective etching ratio of the insulating film to the impurity diffusion layer in the semiconductor substrate. As a result, the generation of the leakage current from the contact portion between the impurity diffusion layer and the conductive film is relaxed, and also the refresh characteristic is improved in the memory cell.

For example, in the step of exposing the semiconductor substrate to the plasma by etching the insulating film on the semiconductor substrate, the titanium ion is positively introduced into the semiconductor substrate. According to this process, the crystal defect of the semiconductor substrate by the etching can be reduced and also the leakage current from the storage node can be reduced. Then, the DRAM having the memory cell that is excellent in the refresh characteristic is formed.

The titanium can be injected into the impurity diffusion layer by utilizing the over-etching in the insulating film etching step to form the storage contacts. Therefore, the refresh characteristic improving effect can be achieved not to require the addition of the special equipment and steps.

BRIEF DESCRIPTION OF THE DRAWINGS

Figures 1A, 1B:
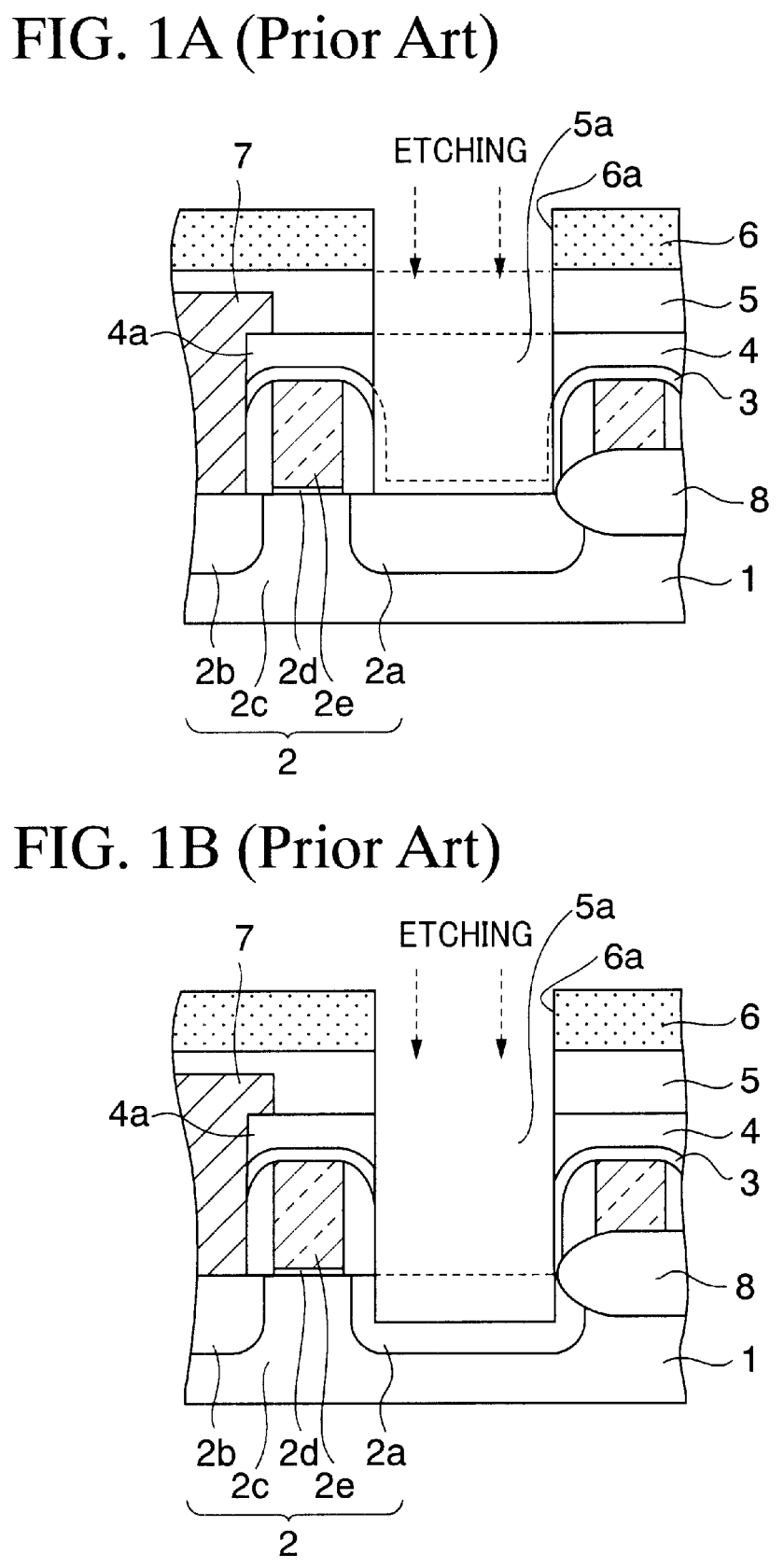

FIGS. 1A and 1B are sectional views showing steps of forming the contact hole in the prior art;

DESCRIPTION OF THE PREFERRED EMBODIMENT

An embodiment of the present invention will be explained with reference to the accompanying drawings hereinafter.

FIGS. 2A to 2L are sectional views showing steps of manufacturing a semiconductor device according to an embodiment of the present invention.

The steps required to form a structure shown in FIG. 2A will be explained hereunder.

First, a silicon oxide ($SiO_2$) film 2 is formed by thermally oxidizing a surface of a p-type silicon (singlecrystalline semiconductor) substrate 1, and then a silicon nitride ($Si_3N_4$) film 3 is formed on the $SiO_2$ film 2 by the CVD method. Then, a resist pattern (not shown) for covering a device forming region A is formed on the $Si_3N_4$ film 3, and then the $Si_3N_4$ film 3 and the $SiO_2$ film 2 are dry-etched by using the resist pattern as a mask to expose a device isolation region on a surface of the silicon substrate 1. Then, the resist pattern is removed.

Then, a field oxide film 4 is formed on an exposed surface of the silicon substrate 1 by wet-oxidizing the silicon substrate 1 while using the $Si_3N_4$ film 3 as a mask. Then, as shown in FIG. 2B, the surface of the silicon substrate 1 in the device forming region A is exposed by removing the $Si_3N_4$ film 3 and the underlying $SiO_2$ film 2 by virtue of the wet etching.

In this case, the phosphoric acid is used to remove the $Si_3N_4$ film 3, and the hydrofluoric acid is used to remove the $SiO_2$ film 2.

Figure 2A:
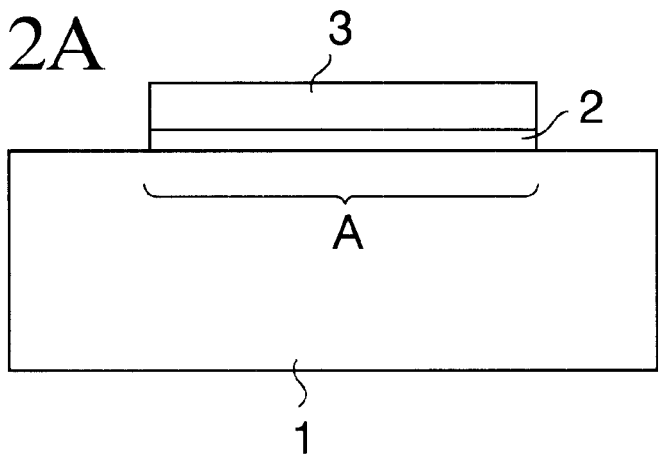
FIGS. 2A to 2L are sectional views showing steps of forming a DRAM memory cell according to an embodiment of the present invention.
Figure 2B:
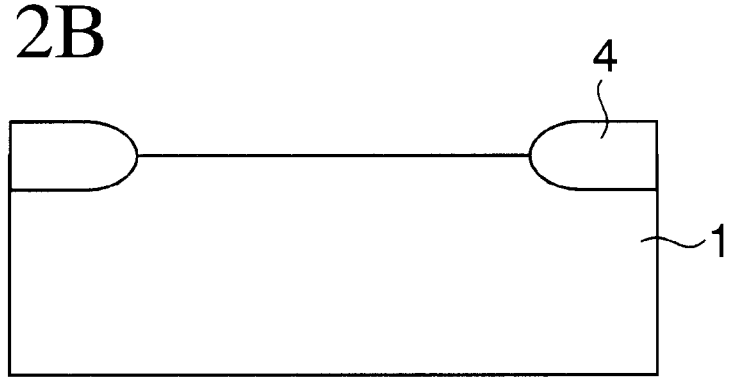
Figure 2C:
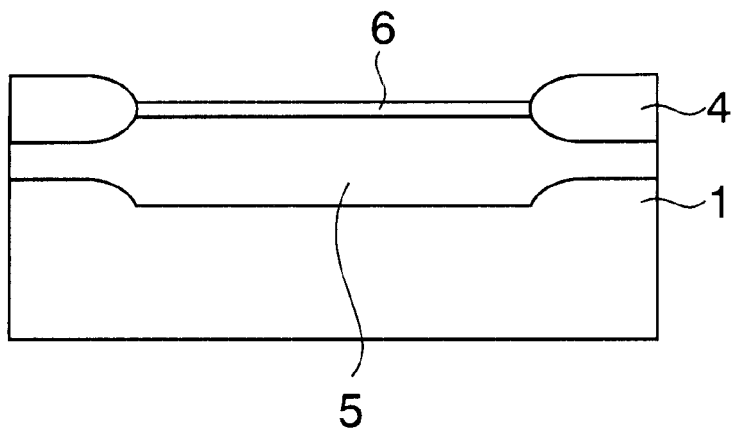

Then, as shown in FIG. 2C, a $p^-$-type well 5 is formed in the silicon substrate 1 by implanting the boron ion into the silicon substrate 1 to control the threshold value. Then, a gate insulating film 6 of 10 nm thickness is formed by thermally oxidizing the surface of the device forming region A on the silicon substrate 1.

Figure 2D:
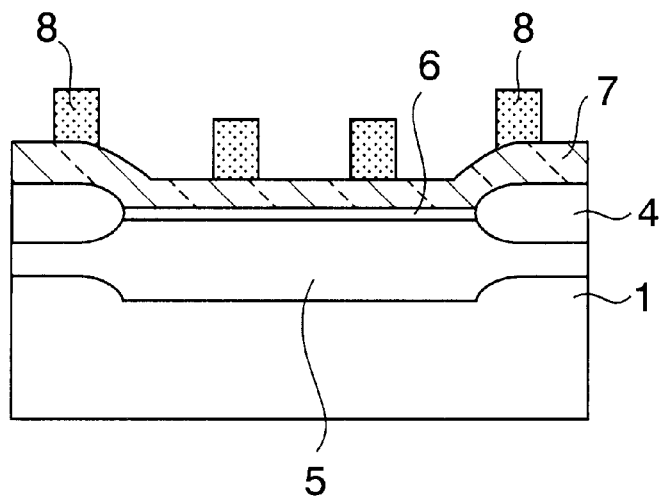

Then, as shown in FIG. 2D, a conductive layer 7 made of polysilicon or silicide is formed on the gate insulating film 6 and the field oxide film 4 to have a thickness of 160 nm. Further, resist patterns 8 having shapes of the gate electrode and the word line are formed on the conductive layer 7.

Figure 2E:
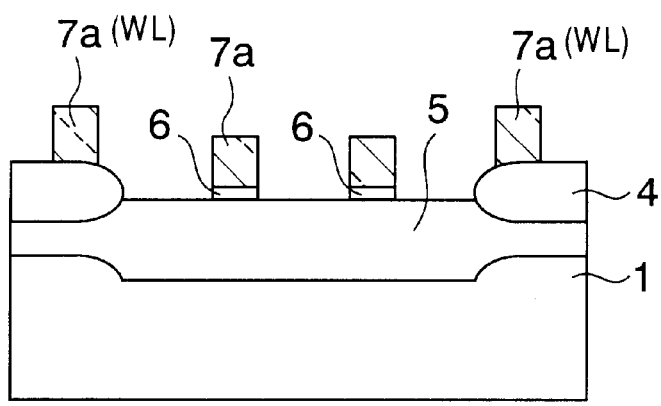

Then, as shown in FIG. 2E, gate electrodes 7a made of polysilicon or silicide are formed by dry-etching the conductive layer 7 while using the resist patterns 8 as a mask. The gate electrodes 7a are also used as word lines WL that pass through over the field oxide film 4 and a plurality of device forming regions A. In the device forming region A of the DRAM memory cell, two gate electrodes 7a are formed at a distance.

The resist patterns 8 are removed. Then, as shown in FIG. 2E, the gate insulating film 6 is removed by the wet etching using the hydrofluoric acid except the area immediately under the gate electrodes 7a. Thus, the silicon substrate 1 is exposed on both sides of two gate electrodes 7a in each device forming region A.

Figure 2F:
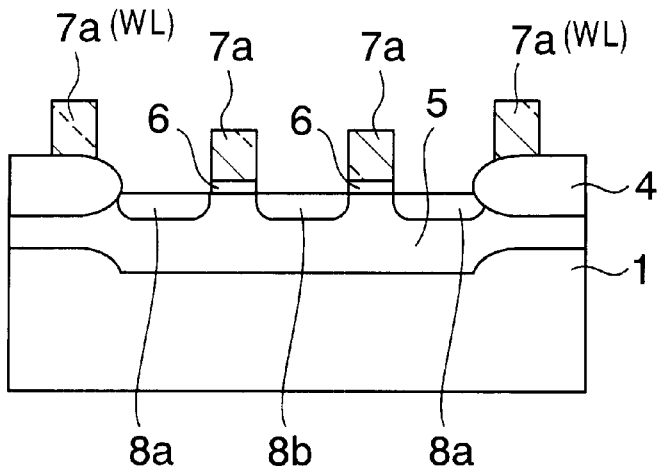

Then, as shown in FIG. 2F, phosphorus ions ($P^+$) are implanted into the silicon substrate 1 by using the gate electrodes 7a and the field oxide film 4 as a mask. Thus, low concentration n-type impurity diffusion areas 8a, 8b are formed on both sides of two gate electrodes 7a in the device forming region A.

Figure 2G:
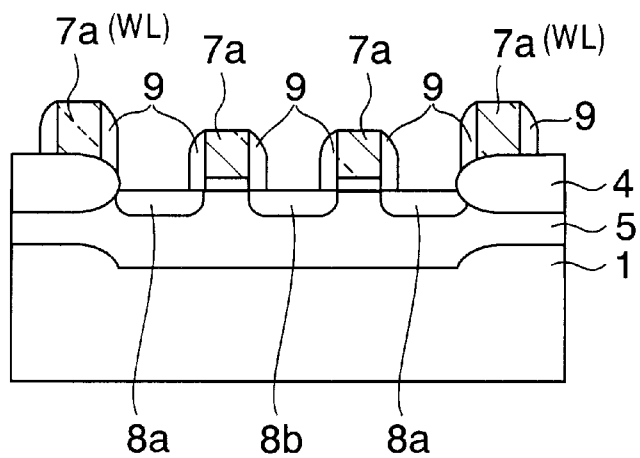

In turn, the $SiO_2$ film is formed on the overall surface of the silicon substrate 1 to cover the gate electrodes 7a. Then, as shown in FIG. 2G, insulating sidewalls 9 are formed on the side walls of the gate electrodes 7a by etching the $SiO_2$ film in the substantially vertical direction.

More, when arsenic ions ($As^+$) are implanted into the silicon substrate 1 by using the insulating sidewalls 9, the gate electrodes 7a, and the field oxide film 4 as a mask, high concentration impurity diffusion regions are formed on both sides of two gate electrodes 7a and the insulating sidewalls 9 in each device forming region A, whereby the impurity diffusion regions 8a, 8b have an LDD (Lightly Doped Drain) structure.

Then, the $SiO_2$ film 10 of 50 nm thickness is formed by the CVD method to cover the gate electrodes 7a, and then a first interlayer insulating film 11 made of silicon oxide or impurity-containing silicon oxide (PSG, BPSG, etc.) is formed thereon by the CVD method to have a thickness of 250 nm. In this case, the annealing may be applied to planarize an upper surface of the first interlayer insulating film 11.

Figure 2H:
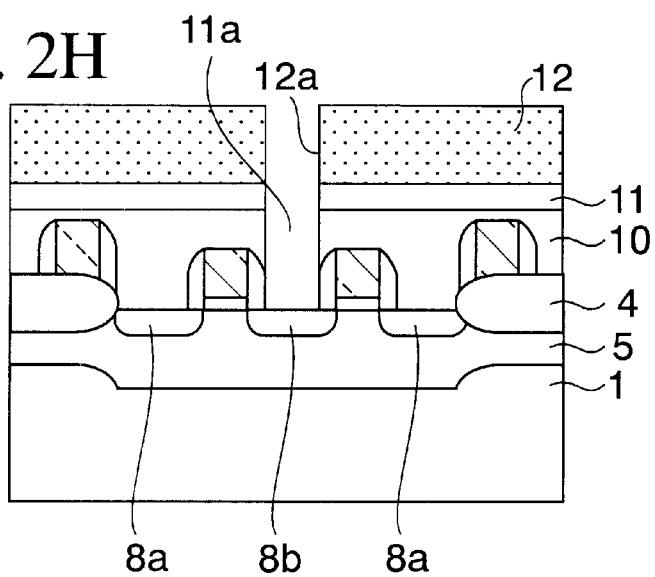

Next, resist 12 is coated on the first interlayer insulating film 11, and then an opening portion 12a is formed on the impurity diffusion region 8b located in the center of the device forming region A by exposing/developing the resist 12, as shown in FIG. 2H.

Then, a bit-line contact hole 11a for exposing the impurity diffusion region 8b is formed by dry-etching the first interlayer insulating film 11 and the underlying SiO$_2$ film 10 via the opening portion 12a by means of the parallel-plate type RF plasma etching equipment. Then, the resist 12 is removed.

Figure 2I:
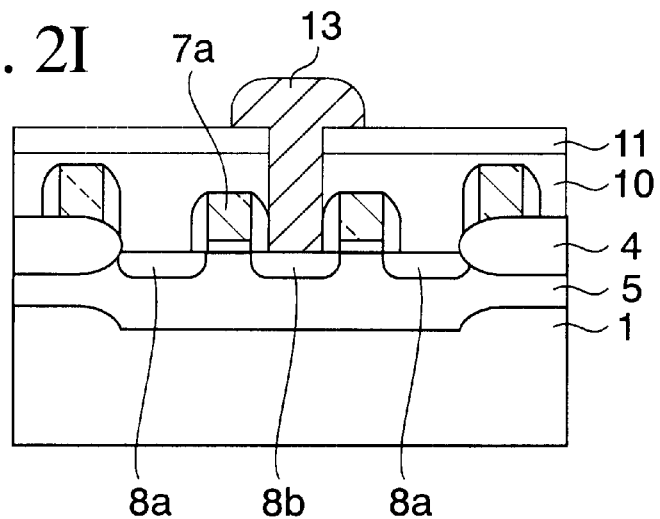

Then, an n-type impurity-containing polysilicon film of 150 nm thickness is formed in the contact hole 11a and on the first interlayer insulating film 11 by the CVD method. Then, the polysilicon film on the first interlayer insulating film 11 is patterned by the photolithography method. Thus, as shown in FIG. 2I, a bit line 13 that is connected to the impurity diffusion region 8b via the contact hole 11a is formed on the first interlayer insulating film 11.

In this case, since the leakage current does not so serious at the connecting portion between the bit line 13 and the impurity diffusion region 8b, the conditions that can enhance the selective etching ratio of the SiO$_2$ film 10 to the impurity diffusion region 8b in the silicon substrate 1 can be set.

Figure 2J:
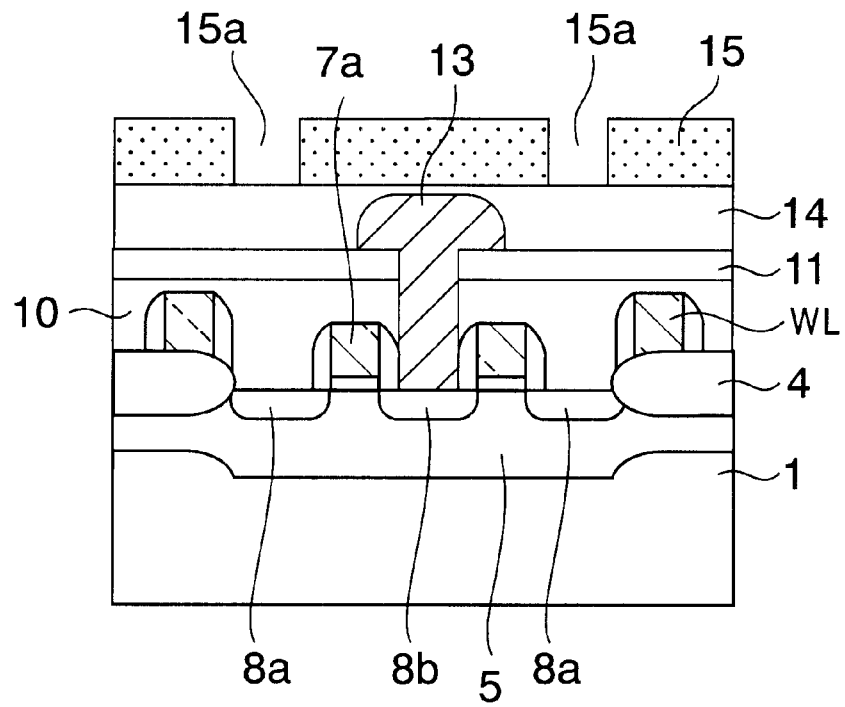

Then, as shown in FIG. 2J, a second interlayer insulating film 14 made of BPSG, PSG, etc. for covering the bit lime 13 is formed on the first interlayer insulating film 11 by the CVD method to have a thickness of 60 nm, and then resist 15 is coated on the second interlayer insulating film 14. Then, openings 15a are formed over the impurity diffusion layers 8a, 8b located near both ends of the device forming region A by exposing/developing the resist 15.

Figure 2K:
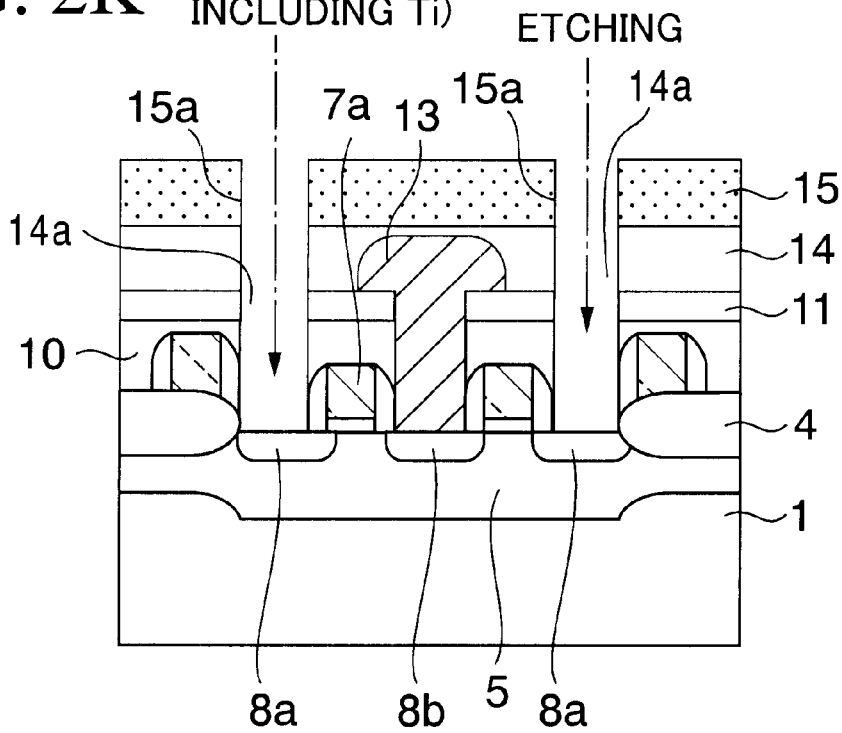

Next, as shown in FIG. 2K, storage contact holes 14a are formed on the impurity diffusion layers 8a on both end portions of the device forming region A by sequentially etching the second interlayer insulating film 14, the first interlayer insulating film 11, and the SiO$_2$ film 10 via the openings 15a in the resist 15.

Figure 3:
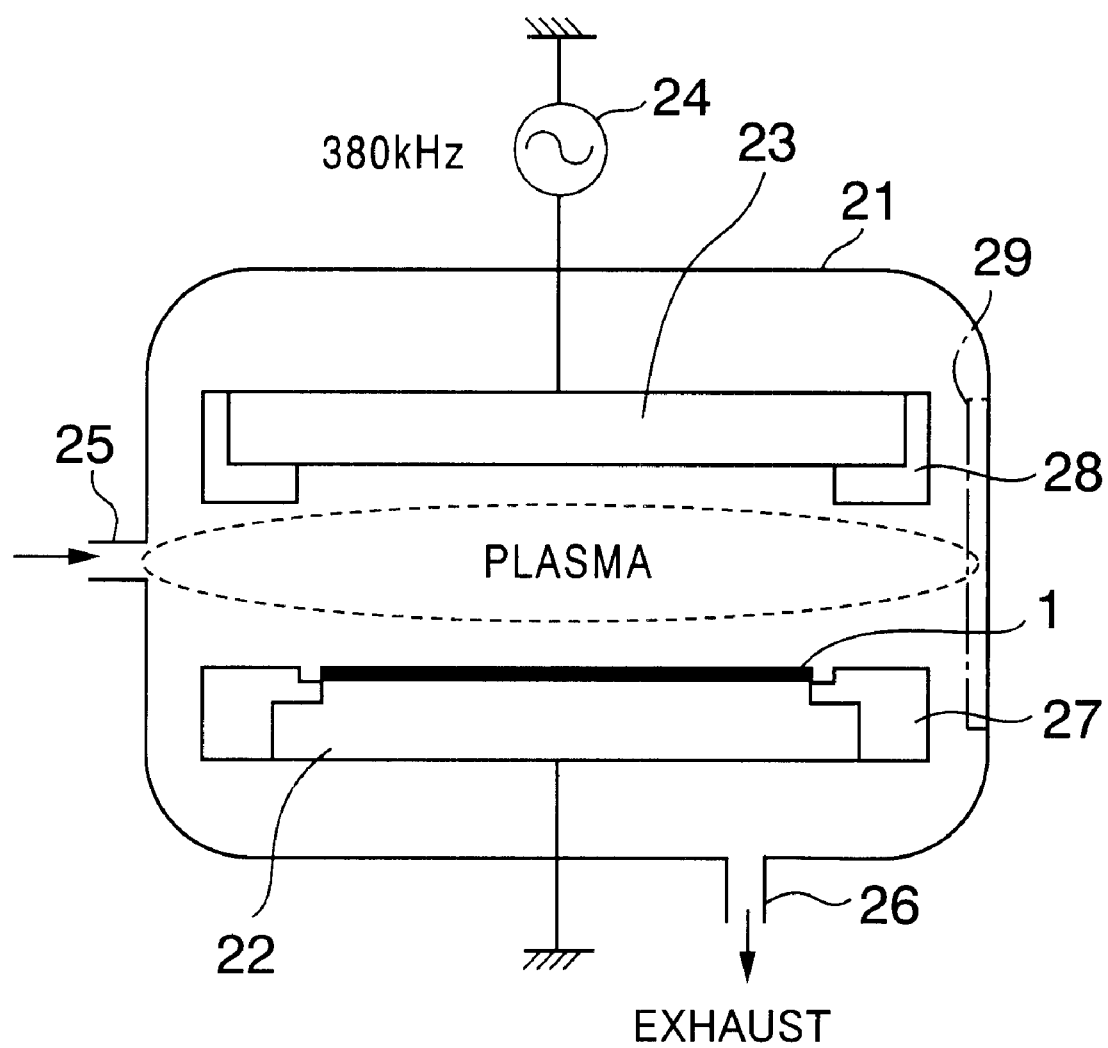
FIG. 3 is a view showing an example of a structure of the etching equipment employed in the embodiment of the present invention.

This etching is executed by using the parallel-plate type plasma etching equipment shown in FIG. 3. A lower electrode 22 on an upper surface of which the silicon substrate 1 is loaded and an upper electrode 23 which opposes to the lower electrode 22 at a distance are provided in a chamber 21 of the plasma etching equipment. The lower electrode 22 is grounded and the upper electrode 23 is connected to a high frequency power supply 24. The chamber 21 has a gas introducing port 25 for introducing the reaction gas and an exhaust port 26 for exhausting the inner gas. Also, a focus ring 27 made of silicon is fitted to the periphery of the lower electrode 22, and also a shield ring 28 is fitted to the periphery of the upper electrode 23. In addition, a temperature controlling mechanism (not shown) is fitted to the bottom of the lower electrode 22.

In etching the second interlayer insulating film 14, the first interlayer insulating film 11, and the SiO$_2$ film 10, the power applied to the upper electrode 23, the reaction gas introduced into the chamber 21, etc. are set as shown in Table 1 and also a titanium element is contained in the chamber 21 by using a titanium generating source described later. Accordingly, in the state that the etching is completed, a titanium concentration in the impurity diffusion layers 8a, 8b under the storage contact holes 14a is controlled in a range of more than $1 \times 10^{11}$ atoms/cm$^2$ and less than $1 \times 10^{15}$ atoms/cm$^2$.

Also, in the etching, the peak-to-peak voltage of the high frequency power supply 24 is adjusted to about 2.4 kV so as to enhance the selective etching ratio of the SiO$_2$ film 10 to the impurity diffusion layer 8a in the silicon substrate 1.

TABLE 1

Silicon Oxide Film Etching Conditions

| Etching Atmosphere Pressure | High Frequency Power | Reaction Gas | | | Wafer Temperature |
|---|---|---|---|---|---|
| | | CHF$_3$ | CF$_4$ | Ar | |
| 40 Pa | 4.5 W/cm$^2$ | 10 sccm | 10 sccm | 500 sccm | 10° C. |

The storage contact holes 14a are formed under the above conditions, and the resist 15 is removed.

Figure 2L:
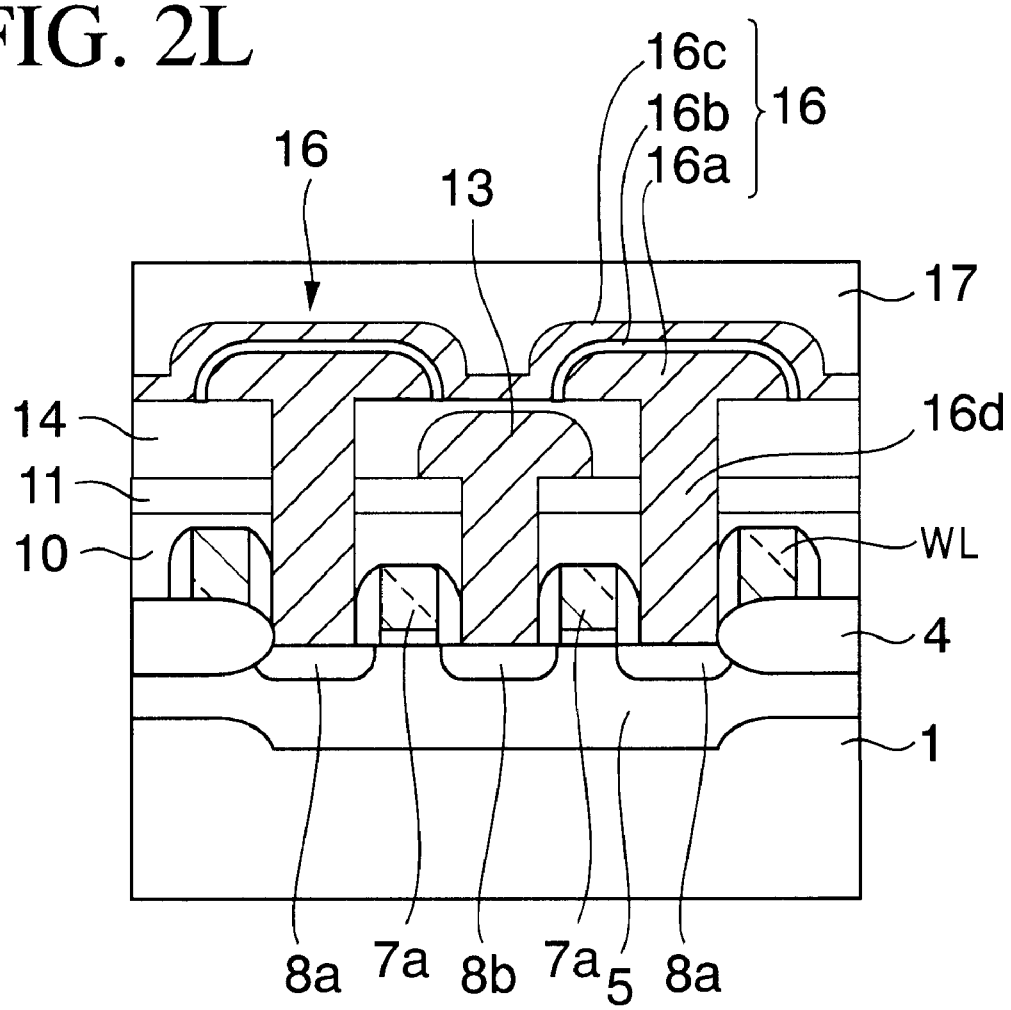

Next, the steps required to get a structure shown in FIG. 2L will be explained hereunder.

First, a doped polysilicon film is formed in the storage contact holes 14a and on the second interlayer insulating film 14. Then, the doped polysilicon film is patterned by the photolithography method to be left in the storage contact holes 14a and their peripheral areas. Thus, the doped polysilicon film on the second interlayer insulating film 14 is used as storage electrodes 16a, and also the doped polysilicon film in the contact holes 14a is used as contact plugs 16d.

Then, a dielectric film 16b is formed on the storage electrodes 16a, and then an opposing electrode 16c made of polysilicon is formed on the dielectric film 16b. As a result, a storage capacitor 16 consisting of the opposing electrode 16c, the dielectric film 16b, and the storage electrode 16a is formed.

After this, a third interlayer insulating film 17 made of silicon oxide, BPSG, PSG, etc. is formed on the second interlayer insulating film 14 and the storage capacitor 16 by the CVD method.

A basic DRAM memory cell is formed according to above steps.

As described above, if titanium is introduced into the impurity diffusion layer 8a in forming the contact holes 14a, the leakage current flowing from the storage electrodes 16a to the impurity diffusion layer 8a can be reduced and thus the leakage of the charges accumulated in the storage capacitor 16 into the silicon substrate 1 can be reduced, whereby a structure that is excellent in the refresh memory characteristic can be formed.

Therefore, the fact that the titanium in the impurity diffusion layer 8a in such storage node has an action for relaxing the leakage current will be explained hereunder.

In the steps of forming the storage contact holes shown in FIG. 2K, the over-etching is needed to compensate the unevenness of the film thicknesses of the second interlayer insulating film 14, the first interlayer insulating film 11, and the SiO$_2$ film 10 on the wafer surface and the unevenness of the etching. Thus, the titanium is introduced into the silicon substrate 1 via the contact holes 14a at least in such over-etching.

In etching the second interlayer insulating film 14, the first interlayer insulating film 11, and the SiO$_2$ film 10, as shown in FIG. 3, a titanium-containing organic compound (organic polymer) 29 as the titanium generating source is previously adhered to the area of the inner wall surface of the chamber 21, which is exposed to the plasma. As the adhering method, there is the method of loading the silicon wafer, on which the titanium film is formed, on the lower electrode 22 of the above etching equipment and then etching it under the same conditions as Table 1. If doing so, the phlorocarbon-based titanium-containing organic compound is adhered to the inner wall of the chamber.

An injection amount of the titanium atoms into the wafer (silicon substrate 1) has been measured previously by using test samples. More particularly, an injection amount of the titanium atoms during the fabrication of the device has been estimated by processing the uncontaminated silicon wafer as the test samples, and then executing the element analysis by using the ICP-MS (Inductively Coupled Plasma Mass Spectrometry) analysis method to form the calibration curves.

An injection depth of the titanium ions into the silicon substrate 1 can be detected by measuring the peak-to-peak voltage $V_{pp}$ of the high frequency voltage applied between the upper electrode 23 and the lower electrode 22 to etch the silicon oxide film. The voltage $V_{pp}$ under the above etching conditions was about 2.4 kV. At this time, the actual ion energy is 1.2 kV that is equivalent to a half value of the voltage $V_{pp}$.

Based on the simulation from the above, the injection depth of the titanium ions into the silicon substrate 1 is about 3 nm.

Figure 4:
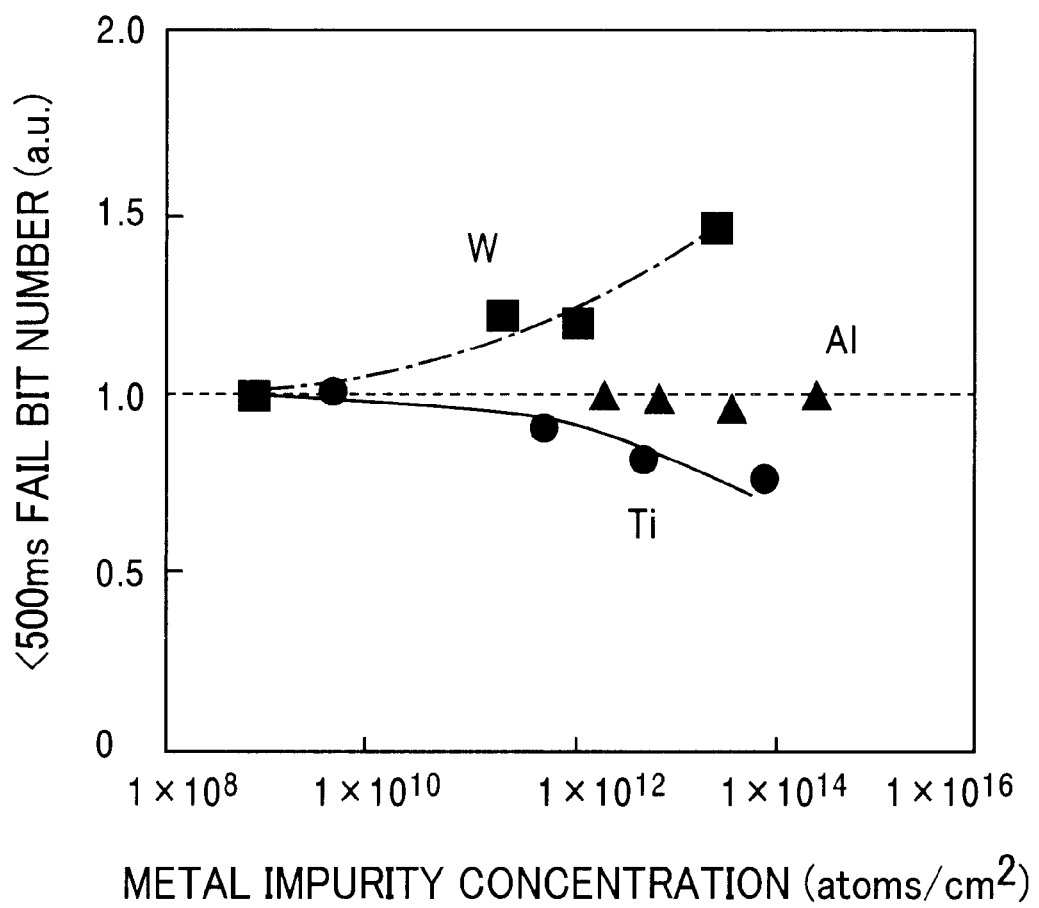
FIG. 4 is a characteristic view showing relationships between concentrations of various metal atoms introduced into a semiconductor substrate and a fail bit number.

FIG. 4 shows the refresh characteristic by counting the number of bits, at which the charge is lost for 500 ms or less, as the failure (fail) bit number in connection with the injection amount depth of the titanium ions. In this case, the values of the above test samples are used as the reference of the injection amount. Therefore, in the actual device, the titanium is injected into the silicon substrate 1 in the area in which the contact holes 14a are opened but the titanium is injected into the resist 15 in the remaining area, and therefore the injection of the titanium does not affect characteristics of the device formed via subsequent steps. Results obtained by injecting tungsten (W) and aluminum (Al) into the silicon substrate 1 via the storage contact holes 14a in the same manner are shown as the comparative example.

As can be seen from FIG. 4, as for the tungsten, the fail bit number is increased as an amount of contamination is increased, as forecasted up to now. In contrast, as for the aluminum, the correlation between the amount of contamination and the fail bit number does not so appear.

This cause may be considered such that the aluminum acts as the p-type impurity in the silicon substrate 1 and thus does not largely affect the device characteristics.

The contamination caused by the aluminum cannot be reduced to less than $1\times10^{12}$ atoms/cm$^2$. This is because the inner wall of the chamber 21 is made of aluminum.

According to FIG. 4, it can be understood that the refresh characteristic is degraded by the contamination caused by the tungsten or the aluminum but, in contrast, the fail bit number can be reduced if the amount of contamination caused by the titanium is increased.

Normally the contamination elements in the chamber of the etching equipment are managed except the aluminum constituting the wall surface of the chamber 21 such that an amount of contamination in the silicon substrate 1 caused by one element should be lower than $1\times10^{11}$ atoms/cm$^2$. As a result, normally the actual amount of contamination in the silicon substrate 1 becomes less than $1\times10^{1}$ atoms/cm$^2$. In the present invention, it can be seen that, if the titanium is injected positively into the impurity diffusion layer 8a in the silicon substrate 1 at a concentration in a range of more than $1\times10^{11}$ atoms/cm$^2$ and less than $1\times10^{15}$ atoms/cm$^2$ not to cause the contamination, the fail bit number can be reduced. The reason for that the metal impurity concentration is set less than $1\times10^{15}$ atoms/cm$^2$ is to avoid the formation of the silicide layer.

Next, the reason for that the fail bit number can be reduced by injecting the titanium will be explained hereunder.

Activation energies required for siliciding the titanium and the tungsten are shown in Table 2.

TABLE 2

Qualities of Various Metal Suicides

| | | | Silicide | | | | |
|---|---|---|---|---|---|---|---|
| (A) | (B) | (C) | (D) | (E) | (F) | (G) | (H) |
| IV-A | Ti | TiSi$_2$ | orthorhombic | 1810 | Si | diffusion control | 1.8 |
| VI-A | W | WSi$_2$ | tetragonal cubic | 2240 | Si | reaction control | 3.0 |

(A)Group
(B)Element
(C)Silicide
(D)Crystal System
(E)Melting Point [K]
(F)Moving Substance
(G)Growth Mechanism
(H)Activation Energy [eV]

It is found that, since the activation energy of the titanium is almost 60% of the tungsten, the titanium is formed easily as the silicide than the tungsten. The energy required for siliciding the titanium in the silicon is obtained from the ion energy at the time of injection or the thermal energy at about 800° C. executed until the semiconductor device is completed. It is supposed that, since the titanium ions injected by these energy are formed as the silicide at the defects in the silicon substrate 1 to get the leakage source, the fail bits can be reduced.

Also, it has been found that, although the reduction is of the voltage $V_{pp}$ not employed in the actual steps since it causes the lowering of the selective etching ratio of the silicon oxide film 10 to the silicon substrate 1, the fail bit number can be reduced by such reduction of the voltage $V_{pp}$. In the results in which the voltage $V_{pp}$ is lowered up to 1.5 kV, it has been understood experimentally that, if the concentration of the titanium is set to almost $1\times10^{11}$ atoms/cm$^2$ to $1\times10^{14}$ atoms/cm$^2$, the fail bit number can be reduced.

Although not particularly shown in Table 2, the activation energy for siliciding the nickel is 1.4 eV, the activation energy for siliciding the cobalt is 1.5 eV, and the activation energy for siliciding the platinum is 1.3 eV. If any of these atoms is contained in the impurity diffusion layers 8a at the concentration of more than $1\times10^{11}$ atoms/cm$^2$ and less than $1\times10^{15}$ atoms/cm$^2$, the same advantage can be achieved.

Following considerations may be made based on these experimental results.

The increase in the voltage $V_{pp}$ is effective to rise the selective etching ratio, but the crystal defects are generated in the impurity diffusion layers 8a in the silicon substrate 1 since the ion energy is also increased at this time. However, it may be considered that the crystal defects in the impurity diffusion layers 8a generated by the etching are changed into the titanium silicide and compensated by injecting the titanium atoms into the impurity diffusion layers 8a at the same time as the etching.

In the above explanation, the titanium-containing organic polymer 21 is employed as the titanium generating source, but the same effect can be attained by other sources. For example, the titanium film may be evaporated previously onto the inner wall of the chamber 21 instead of the titanium-containing organic polymer 21, or the inner wall of the chamber 21 itself may be formed of the titanium alloy. Also, the titanium may be introduced into the material of the electrode, to which the high frequency power is applied to generate the plasma, as the impurity. For example, in most of the parallel-plate type plasma etcher, that employs the typical 380 kHz high frequency power supply 24 as the etcher for forming the storage contact holes 14a, the silicon is employed as the upper electrode 23. The titanium may be doped previously into the upper electrode 23. Accordingly, the titanium ion injection distribution into the silicon wafer (the silicon substrate 1) surface becomes good. In addition to this, the same advantage can be obtained by mixing the titanium compound gas, e.g., titanium fluoride (FTi) or titanium chloride (TiCl) into the plasmanizing etching gas. Otherwise, for example, the titanium may be contained in the focus ring that is made of silicon, or the titanium may be contained in the shield ring 28 that is made of quartz.

In the above embodiment, the titanium ions are injected into the impurity diffusion layers 8a at the time of forming the storage contact holes 14a that are more sensitive to the refresh characteristic. However, since the area of the silicon substrate 1 in which the impurity diffusion layers 8a are formed is exposed several times to the plasma in forming the semiconductor device, the refresh characteristic can be improved other than the time of forming the storage contact holes 14a. Also, after the titanium atoms are introduced into the silicon substrate 1, they are diffused if the thermal energy is present. For this reason, the same effect can be expected by any step if the silicon substrate 1 is exposed to the plasma by such step.

For example, in addition to the step of forming the above step of forming the storage contact holes 14a, the etching step of patterning the silicon nitride film 3 and the silicon oxide film 2 as shown in FIG. 2A, the step of exposing the silicon substrate 1 by the etching to form the gate electrodes 7a as shown in FIG. 2E, and the etching step of forming the sidewalls 9 as shown in FIG. 2G may be listed.

The titanium ions can be introduced into the silicon substrate 1 in the middle of these steps without using the special steps and equipment. In this case, if the titanium ions are introduced into the silicon substrate 1 after these steps, the same effect can be attained.

The DRAM to which the present invention is applied is not limited to the DRAM having the stack-type capacitor explained in the preceding embodiment. The present invention may be applied to the semiconductor device having the fin-type capacitor, the trench-type capacitor, the cylinder-type capacitor, and other capacitors. Also, if the impurity diffusion layer 8b to which the bit line 13 is connected is employed as the impurity diffusion layer into which the metal element such as the titanium, etc. is introduced, the same advantage can be expected. The method of introducing the metal element, that has the siliciding activation energy of less than 1.8 eV, into the impurity diffusion layer 8b and its concentration are similar to the above-mentioned storage node.

As described above, according to the present invention, since the titanium is introduced into the semiconductor substrate, the leakage of the charges caused at the connecting portion between the impurity diffusion layer and the overlying conductive film can be reduced. In addition, since the addition of the special equipment and steps is not required to introduce the titanium, the reduction in throughput is never caused.

Also, in forming the contact hole by etching the insulating film on the semiconductor substrate, there is no necessity that the selective etching ratio of the insulating film to the semiconductor substrate should be lowered. Therefore, the contact between the conductive film in the contact holes and the semiconductor substrate can be held good not to generate the new defect of the semiconductor substrate.

Accordingly, in the semiconductor device, the titanium is introduced into the area of the semiconductor substrate, to which the capacitor is connected. Therefore, since the refresh characteristic can be improved and also the consumption power can be reduced, the present invention can contribute the development of the mobile device.

What is claimed is:

1. A manufacturing method of semiconductor device comprising the steps of:

forming an impurity diffusion layer in a semiconductor substrate;

forming a first insulating film on the semiconductor substrate and the impurity diffusion layer;

forming a contact hole on the impurity diffusion layer by etching a part of the first insulating film;

introducing a metal element, whose siliciding activation energy is less than 1.8 eV, into area of the impurity diffusion layer at a concentration of less than $1 \times 10^{15}$ atoms/cm$^2$; and forming a conductive plug connected to the impurity diffusion layer in the contact hole.

2. A manufacturing method of semiconductor device according to claim 1, further comprising the steps of:

forming a dielectric film of a capacitor on the conductive plug used as a storage electrode; and forming an opposing electrode of the capacitor on the dielectric film.

3. A manufacturing method of semiconductor device according to claim 1, wherein the metal element is formed of any one of titanium, nickel, cobalt, and platinum.

4. A manufacturing method of semiconductor device according to claim 1, wherein a step of the etching of forming the contact hole and a step of introducing the metal element into the area of the impurity diffusion layer are carried out simultaneously.

5. A manufacturing method of semiconductor device according to claim 4, wherein the metal element is introduced into an etching atmosphere, in which the semiconductor substrate is placed in the etching, as a gaseous element.

6. A manufacturing method of semiconductor device according to claim 4, wherein the metal element is supplied from a film that is adhered to a side wall of a chamber of an etching equipment employed in the etching, and then introduced into the area of the semiconductor substrate.

7. A manufacturing method of semiconductor device according to claim 6, wherein the film is a resin film.

8. A manufacturing method of semiconductor device according to claim 6, wherein the film is composed of the metal element.

9. A manufacturing method of semiconductor device according to claim 4, wherein the metal element is supplied from an electrode that is arranged in an etching equipment employed in the etching, and then introduced into the area of the semiconductor substrate.

10. A manufacturing method of semiconductor device according to claim 4, wherein the metal element is supplied from a ring that surrounds an electrode arranged in an etching equipment employed in the etching, and then introduced into the area of the semiconductor substrate.

11. A manufacturing method of semiconductor device according to any one of claim 1, wherein the metal element is introduced into the area of the impurity diffusion layer before the impurity diffusion layer is formed.

12. A manufacturing method of semiconductor device according to claim 11, wherein the metal element is introduced into an etching atmosphere, in which the semiconductor substrate is placed in the etching, as a gaseous element.

13. A manufacturing method of semiconductor device according to claim 11, wherein the metal element is supplied from a film that is adhered to a side wall of a chamber of an etching equipment employed in the etching, and then introduced into the area of the semiconductor substrate.

14. A manufacturing method of semiconductor device according to claim 13, wherein the film is a resin film.

15. A manufacturing method of semiconductor device according to claim 13, wherein the film is composed of the metal element.

16. A manufacturing method of semiconductor device according to claim 11, wherein the metal element is supplied from an electrode that is arranged in an etching equipment employed in the etching, and then introduced into the area of the semiconductor substrate.

17. A manufacturing method of semiconductor device according to claim 11, wherein the metal element is supplied from a ring that surrounds an electrode arranged in an etching equipment employed in the etching, and then introduced into the areas of the semiconductor substrate.

18. A manufacturing method of semiconductor device according to claim 1, further comprising the steps of:

forming the impurity diffusion layer by introducing an impurity into both sides of gate electrodes as an element constituting a MOS transistor; and forming a second insulating film on an overall surface of the semiconductor substrate, and then etching the second insulating film to leave it on both sides of the gate electrodes as sidewall;

wherein the metal element is introduced into the area of the impurity diffusion layer simultaneously with etching of the second insulating film.

19. A manufacturing method of semiconductor device according to claim 18, wherein the metal element is introduced into an etching atmosphere, in which the semiconductor substrate is placed in the etching, as a gaseous element.

20. A manufacturing method of semiconductor device according to claim 18, wherein the metal element is supplied from a film that is adhered to a side wall of a chamber of an etching equipment employed in the etching, and then introduced into the area of the semiconductor substrate.

21. A manufacturing method of semiconductor device according to claim 20, wherein the film is a resin film.

22. A manufacturing method of semiconductor device according to claim 20, wherein the film is composed of the metal element.

23. A manufacturing method of semiconductor device according to claim 18, wherein the metal element is supplied from an electrode that is arranged in an etching equipment employed in the etching, and then introduced into the area of the semiconductor substrate.

24. A manufacturing method of semiconductor device according to claim 18, wherein the metal element is supplied from a ring that surrounds an electrode arranged in an etching equipment employed in the etching, and then introduced into the area of the semiconductor substrate.

25. A manufacturing method of semiconductor device according to claim 1, wherein the metal element is introduced into the area at a concentration of more than $1 \times 10^{11}$ atoms/cm$^2$ and less than $1 \times 10^{15}$ atoms/cm$^2$.

26. A manufacturing method of semiconductor device according to claim 1, wherein the first insulating film is formed of silicon oxide or impurity-containing silicon oxide.

* * * * *